United States Patent [19]
Goto et al.

[11] Patent Number: 4,639,988
[45] Date of Patent: Feb. 3, 1987

[54] METHOD OF MAKING QUARTZ OSCILLATORS

[75] Inventors: Hajime Goto; Ikuzo Amemiya; Masanobu Nakayama, all of Yokohama; Yoshinobu Hatano, Ebina, all of Japan

[73] Assignee: Kanagawa Mfg., Co., Ltd., Yokohama, Japan

[21] Appl. No.: 630,850

[22] Filed: Jul. 13, 1984

[51] Int. Cl.⁴ .............................................. H04R 17/00
[52] U.S. Cl. ..................... 29/25.35; 29/838; 29/882; 310/353
[58] Field of Search ............... 29/25.35, 838, 882, 29/884; 140/105, 147; 310/353, 351

[56] References Cited
U.S. PATENT DOCUMENTS
2,955,352 10/1960 Wintriss ............................. 29/882
3,798,761 3/1974 De Jong ............................. 29/882

OTHER PUBLICATIONS

Hastede, et al, Core Plane Terminal Forming Die, IBM Tech. Disclosure Bull., vol. 8, No. 9, Feb. 1966, p. 1208.

*Primary Examiner*—Howard N. Goldberg
*Assistant Examiner*—P. W. Echols
*Attorney, Agent, or Firm*—Holman & Stern

[57] ABSTRACT

A method of making quartz oscillators wherein, round-sectioned bar-shaped leads are inserted through a base and are glass-sealed to be secured to the base, the parts above the base are pressed to form flat plate-shaped inner parallel spaced leads, so that the leads annealed in the glass-sealing step will be compressed and hardened, and the inner leads will be resilient to enable a quartz piece to be resiliently held by its sides when it is inserted between the inner leads. The steps can be automated and the cost of manufacturing the oscillators can be reduced.

12 Claims, 25 Drawing Figures

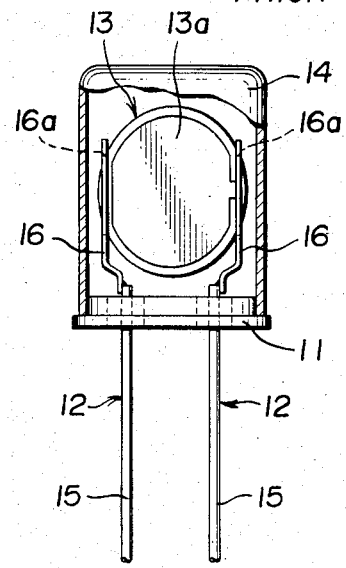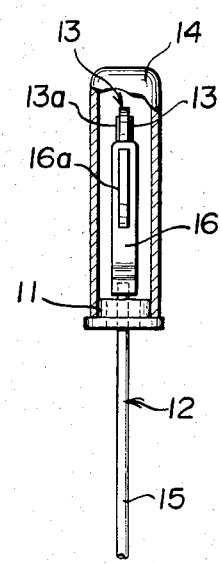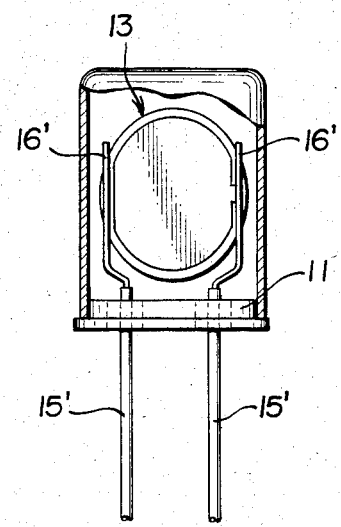

METHOD OF MAKING QUARTZ OSCILLATORS

BACKGROUND OF THE INVENTION

1. Field of the Invention

This invention relates to methods of making quartz oscillators.

2. Description of the Prior Art

As shown in FIGS. 10 and 11, generally, a quartz oscillator comprises a base 11, a pair of leads 12 inserted through and glass-sealed to the base 11, a quartz piece 13 held between the tips of the leads 12 and a cap 14 covering the quartz piece 13. In such quartz oscillator, as in FIG. 10, flat plate-shaped inner leads 16 having respectively slots 16a for inserting the quartz piece are fused respectively to the tips of round-sectioned bar-shaped outer leads 15 inserted through and secured to the base 11 in advance, the quartz piece 13 is inserted between these inner leads and its electrode plates 13a and 13b are electrically connected with the inner leads 16 through a conductive bonding agent or by soldering so as to be assembled or, as in FIG. 11, outer leads 15' and inner leads 16' are respectively integrally formed by press-molding round-sectioned bar-shaped lead wires at the tips, then the outer leads 15' are inserted through and glass-sealed to the base 11 and the quartz piece 13 is fitted to be assembled. However, in the former, the outer leads 15 and inner leads 16 must be manually welded, the direction and spacing of the inner leads 16 will fluctuate and it will be difficult to automate the fitting of the quartz piece 13. In the latter, in the step of glass-sealing the leads within a furnace at 1000° to 1050° C., the inner leads 16' will be annealed and will lose their resiliency. Therefore, if they are subsequently spread apart or expanded and the quartz piece 13 is inserted between them, the inner leads 16' will be irrecoverably plastically deformed and will not be able to hold the quartz piece as they are intended to. Therefore, the assembly is made manually at a low efficiency.

BRIEF SUMMARY OF THE INVENTION

The present invention overcomes the above mentioned problems of the conventional methods of making quartz oscillators.

An object of the present invention is to provide a quartz oscillator manufacturing method which is adapted to an efficient continuous automatic assembly.

BRIEF DESCRIPTION OF THE DRAWINGS

The invention will now be described in detail with reference to the accompanying drawings, wherein:

FIG. 10(A) is a partly cross-sectional elevational view of a quartz oscillator made by a conventional method;

FIG. 10(B) is a partly cross-sectional side elevational view of FIG. 10(A); and

FIG. 11 is a partly cross-sectional elevational view of a quartz oscillator made by another conventional method.

DETAILED DESCRIPTION

Figure 1:
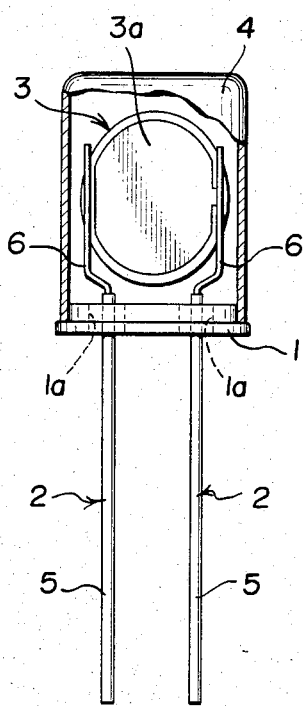
FIG. 1(A) is a partly cross-sectional elevational view of a quartz oscillator made according to the method of the present invention.
FIG. 1(B) is a partly cross-sectional top plan view of FIG. 1(A)
FIG. 1(C) is a partly cross-sectional side elevational view side view of FIG. 1(A)
Figure 1:
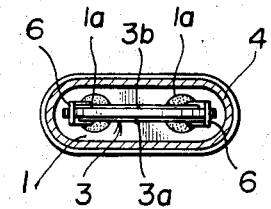
Figure 1:
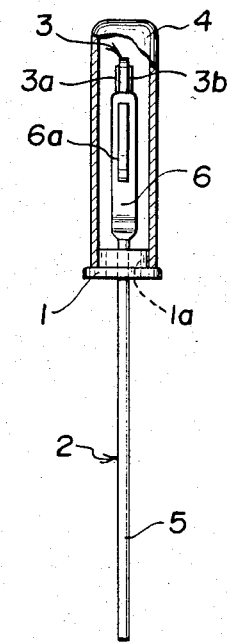
Figure 2:
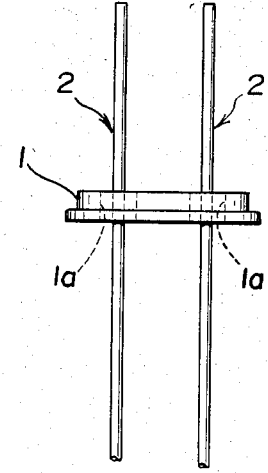
FIG. 2(A) is an elevational view showing the first step of assembling the quartz oscillator in accordance with the invention.
FIG. 2(B) is a top plan view of FIG. 2(A)
Figure 2:
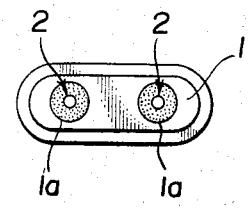

As shown in FIG. 1, a quartz oscillator made in accordance with the method of the invention comprises a base 1, a pair of leads 2 inserted through and fixed to the base 1, a quartz piece 3 provided between the tips of the leads 2 and a cap 4 fitted to the base 1 so as to cover the quartz piece 3.

A pair of holes 1a are formed in the base 1. Each lead 2 consists of a round-sectioned bar-shaped outer lead 5 extending downward and a flat inner lead 6 projecting upward of the base 1 and covered with the cap 4. A slot 6a for inserting the quartz piece 3 is formed in each inner lead 6.

The quartz piece 3 is substantially diskshaped and is inserted on both sides into the slot 6a of the inner leads 6. Electrode plates 3a evaporatively deposited on both surfaces of the quartz piece 3 are soldered to the inner leads 6.

The quartz oscillator formed as above is assembled in the steps shown in FIGS. 2 through 9. In this method the round-sectioned bar-shaped leads 2 are firt inserted through and then glass-sealed in the respective holes 1a of the base 1 to obtain the state shown in FIG. 2. The leads 2 are glass-sealed within a furnace at 1000° to 1050° C. so as to be annealed in this step.

Figure 3:
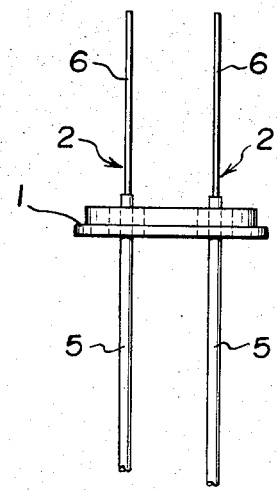
FIG. 3(A) is an elevational view showing the second step of assembling the quartz oscillator.
FIG. 3(B) is a top plan view of FIG. 3(A)
FIG. 3(C) is a side elevational view of FIG. 3(A)
Figure 3:
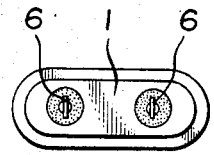
Figure 3:
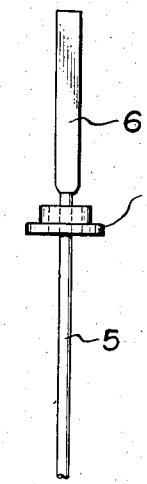
Figure 7:
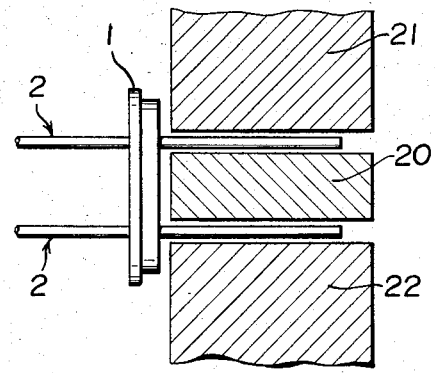
FIG. 7(A) is a partly cross-sectional elevational view showing a press-molding step for obtaining the state in FIG. 3.
FIG. 7(B) is a side elevational view of FIG. 7(A)
Figure 7:
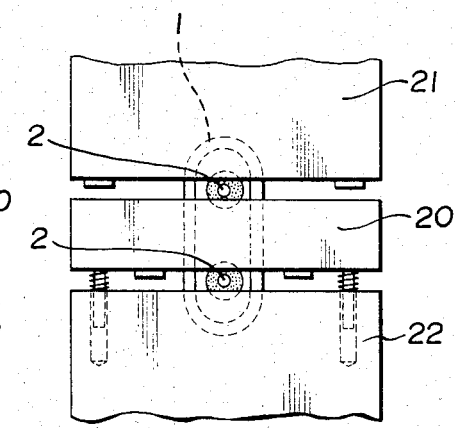

Then, the leads 2 are pressed in the parts above the base 1 to form the flat inner parallel leads 6 opposed to each other to obtain the state shown in FIG. 3. By this step, the annealed leads 2 will be compressed and hardened so that the inner leads 6 can be resilient. In this step, for example, as shown in FIG. 7, a vertically movable intermediate die 20 is inserted between the parts above the base 1 of the two leads 2 arranged between a vertically movable upper die and a fixed lower die 22 and the upper die 21 and intermediate die 20 are lowered to be able to flatly compress the leads 2 between the three dies 20, 21 and 22.

Figure 4:
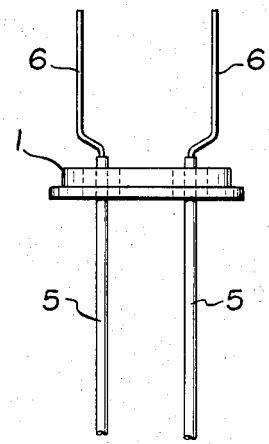
FIG. 4(A) is an elevational view showing the third step of assembling the quartz oscillator.
FIG. 4(B) is a top plan view of FIG. 4(A)
FIG. 4(C) is a side elevational view of FIG. 4(A)
Figure 4:
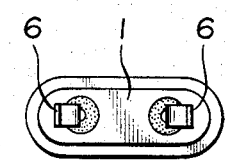
Figure 4:
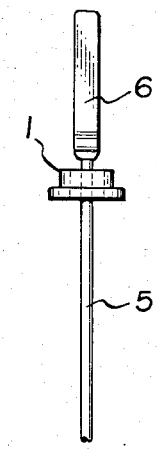
Figure 8:
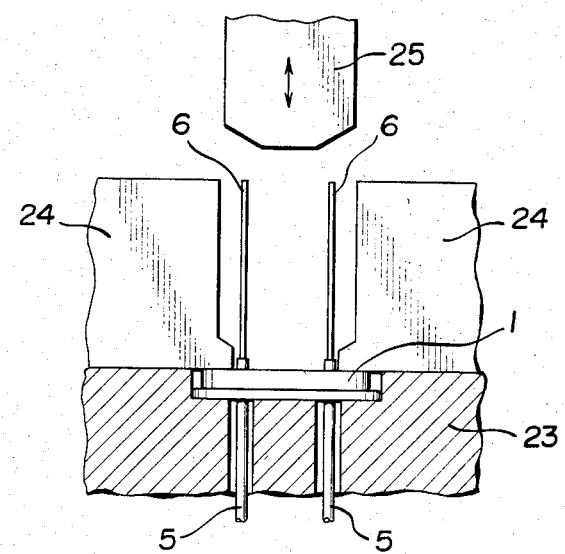
FIG. 8 is a partly cross-sectional elevational view showing a pressmolding step for obtaining the state in FIG. 4.

Then, the inner leads 6 are bent with a die so as to be spaced from each other at equal distances from the base center to obtain the state shown in FIG. 4. In this step, for example as shown in FIG. 8, the base 1 is placed on a guide 23, receiving dies 24 are butted respectively to the outsides of the lower ends of inner leads 6 and an upper vertically movable die 25 centered with the guide 23 is lowered from above between both inner leads 2.

Figure 5:
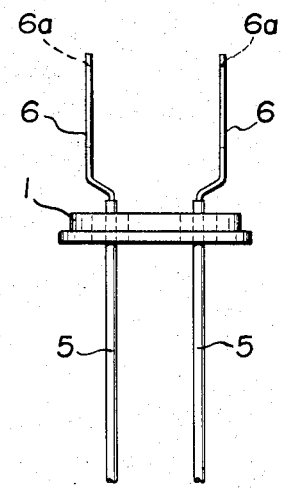
FIG. 5(A) is an elevational view showing the fourth step of assembling the quartz oscillator.
FIG. 5(B) is a top plan view of FIG. 5(A)
FIG. 5(C) is a side elevational view of FIG. 5(A)
Figure 5:
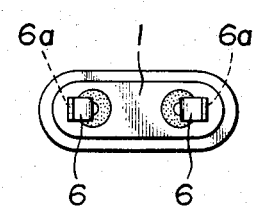
Figure 5:
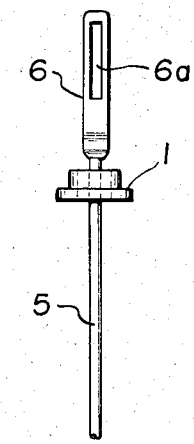
Figure 9:
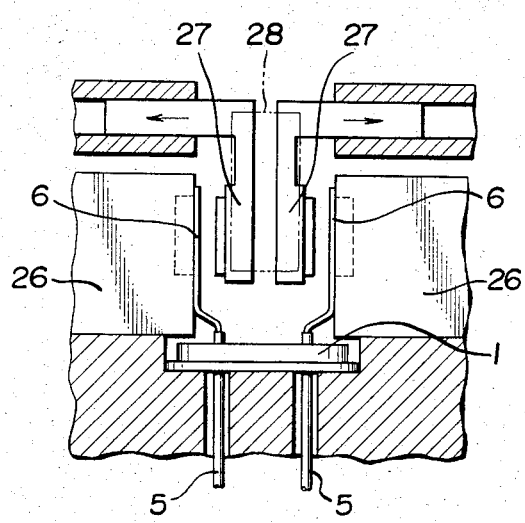
FIG. 9(A) is a partly cross-sectional elevational view of a press-molding step for obtaining the state in FIG. 5.
FIG. 9(B) is a top plan view of FIG. 9(A)
Figure 9:
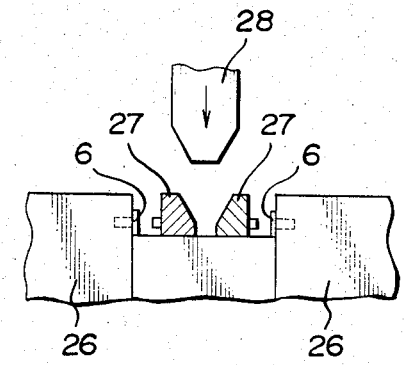

Then, slots 6a for inserting the quartz piece are formed in the respective inner leads 6 to obtain the state shown in FIG. 5. In this step, for example as shown in FIG. 9, a pair of receiving dies 26 are butted respectively to the outsides of the inner leads 6 and a pair of punching dies 27 inserted between the inner leads 6 are pushed outwardly apart by a wedge 28.

Figure 6:
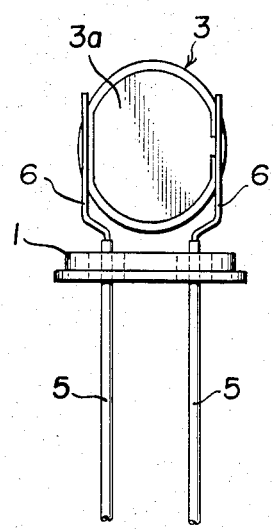
FIG. 6(A) is an elevational view showing the fifth step of assembling the quartz oscillator.
FIG. 6(B) is a top plan view of FIG. 6(A)
FIG. 6(C) is a side elevational view of FIG. 6(A)
Figure 6:
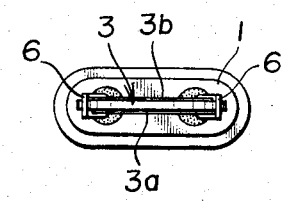
Figure 6:
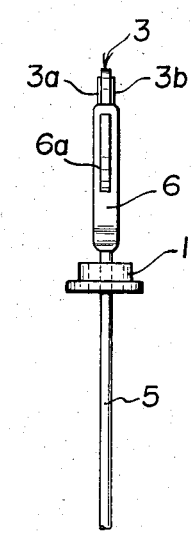

Then, the inner leads 6 are resiliently pushed apart and expanded from each other and the quartz piece 3 is placed between them and is inserted on both sides into the slots 6a to obtain the state shown in FIG. 6.

Then, the inner leads 2 are electrically connected respectively with the electrode plates 3a and 3b on both surfaces of the quartz piece 3 by soldering or through a conductive bonding agent and the cap 4 is fitted to obtain the state shown in FIG. 1.

Other concrete methods of forming the inner leads 6 than are illustrated may be conceived by anyone skilled in the art.

As explained above, in the present invention, as the round-sectioned bar-shaped leads 2 are inserted through the base 1, are glass-sealed to be secured and are pressed in the parts above the base 1 to form the flat plate-shaped parallel inner leads 6 opposed to each other, the leads 2 annealed in the glass-sealing step will be compressed and hardened. Therefore, inner leads 6 will be able to be resilient and the quartz piece 3 will be able to be resiliently held when it is inserted between the inner leads 6 and also, in this step, the directions and positions of the inner leads 6 and the distance between them can be arranged to be constant so that the subsequent quartz piece 3 inserting operations and the other operations can be automated and the cost of producing the quartz oscillator can be reduced to about ⅓ by mass-production.

We claim:

1. A method of making quartz oscillators, wherein a pair of leads having a substantially circular cross-sectional shape and inner ends inserted respectively through a pair of holes in a base are glass-sealed to the base at the holes and have inner leads projecting respectively from the inner ends of the leads inserted through the base, and a quartz member having opposite side edges inserted through slots in the inner leads has a pair of electrode plates on opposite sides thereof electrically connected to the inner leads, comprising:

providing a base having a pair of spaced holes therethrough;

inserting a pair of elongated substantially circular cross-sectional shaped leads respectively through said holes so that portions thereof extend on opposite sides of the base to provide outer and inner spaced leads;

glass-sealing said leads in said holes to secure said leads to said base;

compressing said inner leads in dies to form hardened, resilient, flat plate-shaped inner leads extending in parallel spaced relationship with respect to each other;

bending the ends of the inner leads adjacent said base outwardly with respect to each other to displace said inner leads outwardly with respect to said holes while maintaining a substantial portion of said inner leads in said parallel spaced relationship;

punching elongated slots in said parallel portions of said inner leads by punching die means;

resiliently spreading apart said inner leads;

inserting a disk-shaped quartz element having electrode plates on opposite sides thereof between said inner leads so that the opposite side edges of said quartz element are juxtaposed with respect to said slots;

allowing said inner leads to resiliently return to said parallel position to insert the side edges of the quartz element through said slots into engaging relationship with said inner leads; and electrically connecting said inner leads with said electrode plates of the quartz element.

2. A method as claimed in claim 1 wherein:

said compressing step comprises placing one of said inner leads against the surface of a fixed die element;

placing an intermediate movable die element between said inner leads;

placing a movable die element adjacent the outer face of the other inner lead; and moving said intermediate and movable outer die toward said fixed die to compress said inner leads therebetween to produce said flattened shape.

3. The method as claimed in claim 2 wherein said bending step comprises:

placing said base with said leads connected thereto in a fixed die element;

placing shaping-die elements having a forming surface thereon adjacent the outer faces of said flattened inner leads; and moving a movable die between said flattened inner leads to force them outwardly with respect to each other into the die-shaping surface of said shaping dies.

4. The method as claimed in claim 3 wherein said punching step comprises:

positioning said base in a fixed die;

positioning an intermediate backing die having elongated punch-receiving recesses therein against the outer faces of said inner leads;

inserting a pair of punching dies between said inner leads; and driving said punching dies outwardly with respect to each other against the inner faces of said inner leads to punch said slots at said punch-receiving recesses.

5. A method as claimed in claim 4 wherein said electrically connecting step comprises;

soldering said electrode plates to said inner leads.

6. A method as claimed in claim 5 wherein said bending step further comprises:

bending said inner leads so that they are equally spaced from the center of said base.

7. The method as claimed in claim 1 wherein said bending step comprises:

placing said base with said leads connected thereto in a fixed die element;

placing shaping-die elements having a forming surface thereon adjacent the outer faces of said flattened inner leads; and moving a movable die between said flattened inner leads to force them outwardly with respect to each other into the die-shaping surface of said shaping dies.

8. A method as claimed in claim 1 wherein said bending step further comprises:
   bending said inner leads so that they are equally spaced from the center of said base.

9. The method as claimed in claim 1 wherein said punching step comprises:
   positioning said base in a fixed die;
   positioning an intermediate backing die having elongated punch-receiving recesses therein against the outer faces of said inner leads;
   inserting a pair of punching dies between said inner leads; and
   driving said punching dies outwardly with respect to each other against the inner faces of said inner leads to punch said slots at said punch-receiving recesses.

10. A method as claimed in claim 1 wherein said electrical bonding step comprises:
    applying an electrical conductive bonding agent to said inner leads and said electrode plates.

11. A method as claimed in claim 1 wherein said electrically connecting step comprises:
    soldering said electrode plates to said inner leads.

12. A method as claimed in claim 1 wherein said bending step further comprises:
    bending said inner leads so that they are equally spaced from the center of said base.

* * * * *